(12) United States Patent
Pramanik et al.

(10) Patent No.: US 8,975,114 B2
(45) Date of Patent: *Mar. 10, 2015

(54) METHOD FOR FORMING METAL OXIDES AND SILICIDES IN A MEMORY DEVICE

(71) Applicants: Intermolecular Inc., San Jose, CA (US); Kabushiki Kaisha Toshiba, Tokyo (JP); SanDisk 3D LLC, Milpitas, CA (US)

(72) Inventors: Dipankar Pramanik, Saratoga, CA (US); Tony P. Chiang, Campbell, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 70 days.

This patent is subject to a terminal disclaimer.

(21) Appl. No.: 13/804,318

(22) Filed: Mar. 14, 2013

(65) Prior Publication Data
US 2013/0214238 A1 Aug. 22, 2013

Related U.S. Application Data

(63) Continuation of application No. 13/188,835, filed on Jul. 22, 2011, now Pat. No. 8,466,005.

(51) Int. Cl.
| | |
|---|---|
| *H01L 21/00* | (2006.01) |
| *H01L 21/16* | (2006.01) |
| *H01L 45/00* | (2006.01) |
| *H01L 27/10* | (2006.01) |
| *H01L 27/24* | (2006.01) |

(52) U.S. Cl.
CPC .......... *H01L 45/1253* (2013.01); *H01L 27/101* (2013.01); *H01L 45/08* (2013.01); *H01L 45/1233* (2013.01); *H01L 45/146* (2013.01); *H01L 45/16* (2013.01); *H01L 45/1608* (2013.01); *H01L 27/2463* (2013.01)
USPC ........... 438/104; 438/133; 438/201; 438/211; 438/257; 438/593; 257/E21.613; 257/E21.645

(58) Field of Classification Search
CPC ... H01L 27/101; H01L 27/2463; H01L 45/08; H01L 45/1233; H01L 45/146; H01L 45/16; H01L 45/1608; H01L 45/1253
USPC ................ 438/104, 133, 201, 211, 257, 593; 257/E21.613, E21.645
See application file for complete search history.

(56) References Cited

U.S. PATENT DOCUMENTS

| | | | |
|---|---|---|---|
| 2009/0184305 A1* | 7/2009 | Lee et al. | 257/2 |
| 2010/0248422 A1* | 9/2010 | Tanaka | 438/104 |
| 2011/0089391 A1* | 4/2011 | Mihnea et al. | 257/2 |

*Primary Examiner* — Michelle Mandala

(57) ABSTRACT

Embodiments of the invention generally relate to memory devices and methods for fabricating such memory devices. In one embodiment, a method for fabricating a resistive switching memory device includes depositing a metallic layer on a lower electrode disposed on a substrate and exposing the metallic layer to an activated oxygen source while heating the substrate to an oxidizing temperature within a range from about 300° C. to about 600° C. and forming a metal oxide layer from an upper portion of the metallic layer during an oxidation process. The lower electrode contains a silicon material and the metallic layer contains hafnium or zirconium. Subsequent to the oxidation process, the method further includes heating the substrate to an annealing temperature within a range from greater than 600° C. to about 850° C. while forming a metal silicide layer from a lower portion of the metallic layer during a silicidation process.

19 Claims, 3 Drawing Sheets

METHOD FOR FORMING METAL OXIDES AND SILICIDES IN A MEMORY DEVICE

CROSS-REFERENCE TO RELATED APPLICATIONS

This application is a continuation of U.S. patent application Ser. No. 13/188,835, Method for Forming Metal Oxides and Silicides in a Memory Device, filed 22 Jul. 2011 (Parent Application) now U.S. Pat. No. 8,466,005. The Parent Application is a basis for priority and is entirely incorporated by reference herein for all purposes.

BACKGROUND OF THE INVENTION

1. Field of the Invention

Embodiments of the invention generally relate to memory devices and methods for manufacturing such memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element/device with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (e.g., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., about 2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

Metallic silicide materials have become an attractive group of materials utilized as electrode materials in nonvolatile memory device fabrication. Generally, metallic silicide materials have many desirable properties, such as a high electrical conductivity, a work function for providing a low leakage barrier to metal oxides, and sustainability to exposures of high processing temperatures (>650° C.). Metallic silicide materials may be deposited by sputtering from a composite target, however, control of the stoichiometry of the metallic silicide is often difficult and unsuccessful. In examples of metal oxide films used in bipolar switching devices, the metal oxide must remain free of metallic ion impurities or else the degraded metal oxide becomes unreliable and the overall device will fail. The switching effect of the memory device generally occurs due to anionic defects, such as oxygen vacancies, within the metal oxide films. However, if a metallic silicide layer is in contact with an adjacent switching metal oxide film, a portion of the metal within the metallic silicide material will likely diffuse into the switching metal oxide film and greatly degrade the reliability of the switching effect.

Therefore, there is a need for an efficient and controllable process to form a stable metal oxide/silicide stack for a nonvolatile memory device.

SUMMARY OF THE INVENTION

Embodiments of the invention generally relate to nonvolatile memory devices and methods for manufacturing such memory devices. The methods described herein provide the use of a wider range of metal oxides than possible with previous deposition techniques. The metal silicide materials in some examples provide a better bottom electrode for switching than pure silicon. The methods provide desired doping of the film stacks by utilizing the specified temperatures during the oxide/silicide formation processes, therefore, film stacks may be formed which meet or exceed the requirements of switching voltage and on/off currents.

In one embodiment, a method for fabricating a resistive switching memory device is provided and includes depositing a metallic layer on a lower electrode disposed on a substrate and exposing the metallic layer to an activated oxygen source while heating the substrate to an oxidizing temperature within a range from about 300° C. to about 600° C. and forming a metal oxide layer containing a resistive switching metal oxide from an upper portion of the metallic layer during an oxidation process. The lower electrode contains a silicon material (e.g., n-type, polysilicon) and the metallic layer contains a metal, such as hafnium, zirconium, alloys thereof, or combinations thereof. Subsequent to the oxidation process, the method further includes heating the substrate to an annealing temperature within a range from greater than 600° C. to about 850° C. while forming a metal silicide layer from a lower portion of the metallic layer during a silicidation process. Generally, the method also includes forming an upper electrode over the metal oxide layer subsequent to the silicidation process.

In another embodiment, the method for fabricating a resistive switching memory device includes depositing the metallic layer on the lower electrode and forming a metal oxide layer containing a resistive switching metal oxide from an upper portion of the metallic layer during an oxidation process by heating the substrate to an oxidizing temperature within a range from about 10° C. to about 100° C. and exposing the metallic layer to ozone activated by an ultraviolet source. In some examples of the oxidation process utilizing the ultraviolet source, the oxidizing temperature may be about at room temperature, such as within a range from about 15° C. to about 30° C.

In some embodiments, the metal oxide layer and/or the metal silicide layer may contain at least one dopant element derived from the metallic layer and/or the lower electrode. In some embodiments, the metallic layer may be deposited or otherwise formed from a doped metal source or doped during a deposition process. Alternatively, the metallic layer may be deposited or otherwise formed on the lower electrode and subsequently, doped with a dopant element. Similarly, the silicon material of the lower electrode may be deposited or otherwise formed from a doped silicon source or doped during a deposition process. Alternatively, the lower electrode may be deposited or otherwise formed on the substrate and subsequently, the silicon material may be doped with a dopant element.

The metallic layer may have a thickness within a range from about 5 Å to about 100 Å, such as from about 10 Å to about 80 Å, such as from about 20 Å to about 50 Å, for example, about 40 Å. The metallic layer may be deposited by a process such as physical vapor deposition (PVD) or other sputtering process, chemical vapor deposition (CVD), atomic layer deposition (ALD), laser ablation, or electroless deposition.

In some embodiments, the metallic layer further contains at least one dopant element such as aluminum, yttrium, scandium, gadolinium, or combinations thereof. In many examples, the metallic layer containing hafnium or zirconium further contains aluminum as the dopant element. The metallic layer may have a dopant element concentration (e.g., Al concentration) within a range from about 5 at % (atomic percent) to about 15 at %. In one example, the metallic layer contains hafnium and aluminum. In another example, the metallic layer contains zirconium and aluminum. The dopant element may be deposited by a sputtering, co-sputtering, or other PVD process, as well as by CVD, ALD, laser ablation, implantation, electrochemical plating, or electroless deposition. The dopant element may be deposited subsequently to the metallic layer, or usually, may be deposited simultaneously as the metal of the metallic layer. In one example, a hafnium target doped with aluminum is sputtered during the PVD process while depositing the metallic layer. In another example, a hafnium target and an aluminum target are co-sputtered during a PVD process for depositing the metallic layer.

The activated oxygen source may contain or may be formed from at least one oxygen source. Exemplary oxygen sources includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), derivatives thereof, plasmas thereof, or combinations thereof. In many examples, the activated oxygen source contains atomic oxygen or ozone. In some embodiments, the oxidizing temperature may be about 300° C. or less, such as about 200° C. or less, such as about 100° C. or less, such as within a range from about 10° C. to about 100° C., such as from about 10° C. to about 50° C., such as from about 15° C. to about 30° C. during the oxidation process. In other embodiments, the oxidizing temperature may be within a range from about 300° C. to about 600° C., such as from about 350° C. to about 550° C., such as from about 400° C. to about 500° C. during the oxidation process. Also, the oxidizing temperature is maintained for a time period within a range from 30 seconds to about 10 minutes, such as from about 1 minute to about 5 minutes, such as from about 2 minutes to about 4 minutes during the oxidation process. The metal oxide layer has a thickness within a range from about 20 Å to about 80 Å, such as from about 20 Å to about 60 Å, such as from about 30 Å to about 50 Å, for example, about 40 Å.

The substrate may be exposed to an annealing gas which may contain argon, nitrogen, helium, air, mixtures thereof, or combinations thereof during the silicidation process. The annealing temperature may be within a range from about 615° C. to about 1,000° C., such as from about 625° C. to about 800° C., such as from about 650° C. to about 750° C. during the silicidation process. The annealing temperature may be maintained for a time period within a range from about 10 seconds to about 5 minutes, such as from about 30 seconds to about 90 seconds, such as from about 45 seconds to about 75 seconds, for example, about 1 minute, during the silicidation process. The metal silicide layer has a thickness within a range from about 5 Å to about 40 Å, such as from about 8 Å to about 25 Å, such as from about 10 Å to about 20 Å, for example, about 15 Å.

In other embodiments, the silicon material contained within the lower electrode further contains at least one dopant element. In one example, the dopant is fluorine and the silicon material has a fluorine concentration within a range from about 0.5 at % to about 5 at %, such as from about 1 at % to about 4 at %, such as from about 2 at % to about 3 at %. The fluorine forms silicon fluoride bonds at the interface of the metal oxide layer and the metal silicide layer or at the interface of the lower electrode and the metal silicide layer. In some examples, the dopant element, such as fluorine, may be implanted or otherwise incorporated into the metallic layer by an ion implantation process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to nonvolatile memory devices and methods for manufacturing such memory devices. The methods described herein provide a broader range of metal oxides and metal silicides than available with previous deposition techniques. The metal silicide materials in some examples provide a better interface for the lower electrode by reducing switching voltage and on/off currents relative to pure silicon. The methods provide desired doping of the metal oxide/silicide film stack by utilizing the specified temperatures during the oxide/silicide formation processes, therefore, metal oxide/silicide film stacks may be formed which meet or exceed the requirements of switching voltage and on/off currents.

Figure 1:
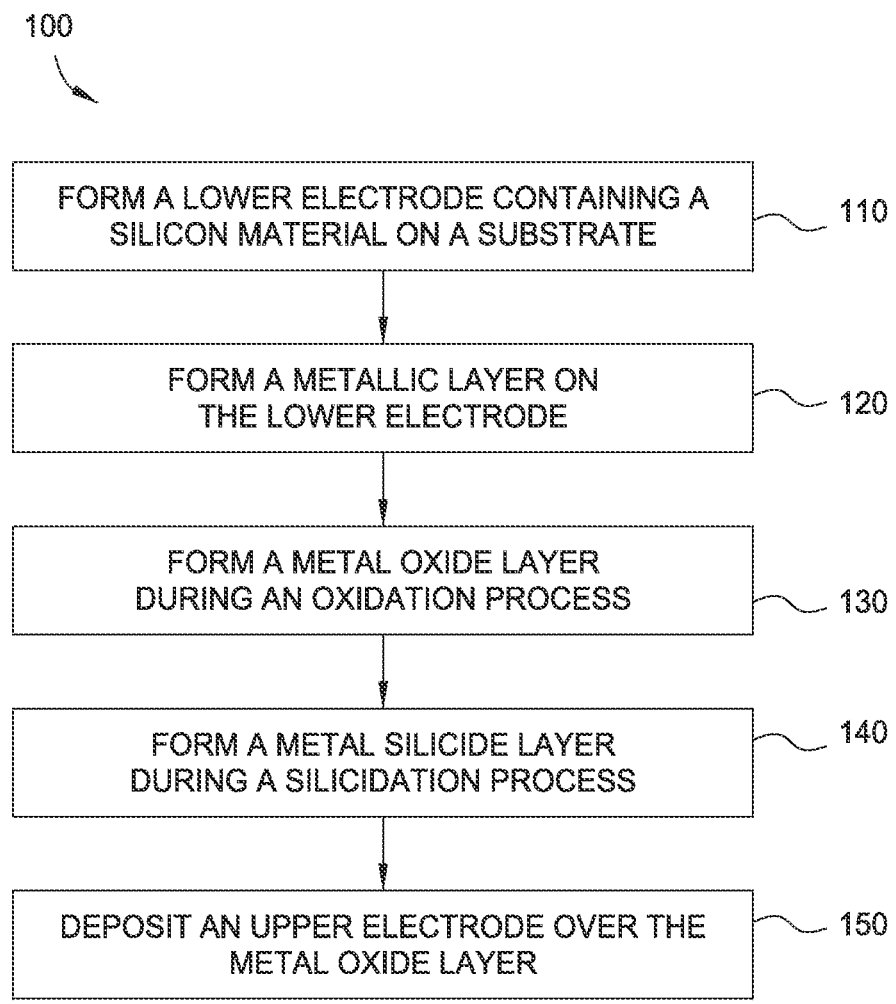
FIG. 1 is a flowchart illustrating a method to form a memory device, as described by embodiments herein.
Figure 2A:
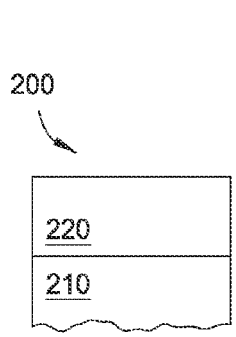
FIGS. 2A-2E depict various stages of the a memory device while being fabricated or otherwise formed during the method illustrated in FIG. 1, as described by embodiments herein.
Figure 2B:
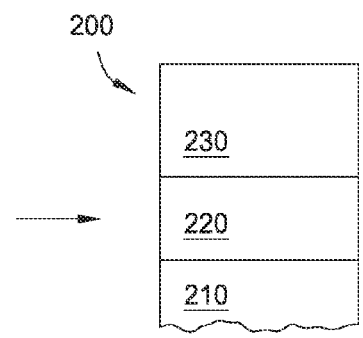
Figure 2C:
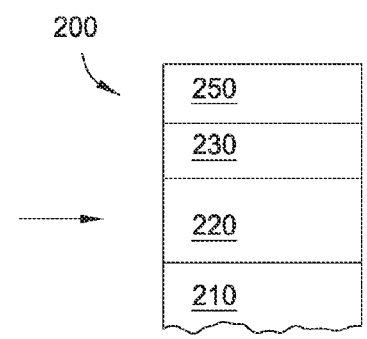
Figure 2E:
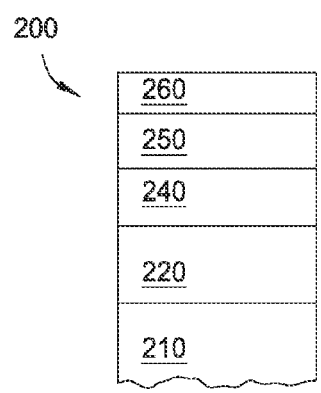

FIG. 1 is a flowchart illustrating a method for manufacturing or otherwise forming various memory devices, as described by embodiments herein, such as process 100 which may be utilized to form resistive switching memory elements/devices, such as memory device 200, as depicted in FIG. 2E. FIGS. 2A-2E depict various stages of fabricating a memory device, such as memory device 200 while being fabricated or otherwise formed during process 100. In one embodiment, process 100 may be used to form memory device 200 and includes forming lower electrode 220 on or over substrate 210 during step 110, forming metallic layer 230 on lower electrode 220 during step 120, forming metal oxide layer 250 from an upper portion of metallic layer 230 by an oxidation process during step 130, forming metal silicide layer 240 from a lower portion of metallic layer 230 by a silicidation process during step 140, and depositing upper electrode 260 on or over metal oxide layer 250 during step 150.

In one embodiment, a method for fabricating a resistive switching memory device is provided and includes depositing metallic layer 230 on lower electrode 220 disposed on substrate 210 and exposing metallic layer 230 to an activated oxygen source while heating substrate 210 containing metallic layer 230 to an oxidizing temperature within a range from about 300° C. to about 600° C. and forming metal oxide layer 250 containing a resistive switching metal oxide from an upper portion of metallic layer 230 during an oxidation process. Lower electrode 220 contains a silicon material and metallic layer 230 contains a metal, such as hafnium, zirconium, alloys thereof, or combinations thereof. Subsequent to the oxidation process, the method further includes heating substrate 210 containing metallic layer 230 to an annealing temperature within a range from greater than 600° C. to about 850° C. forming metal silicide layer 240 from a lower portion of metallic layer 230 during a silicidation process. Generally, the method also includes forming upper electrode 260 over metal oxide layer 250 subsequent to the silicidation process.

In some embodiments, metal oxide layer 250 and/or metal silicide layer 240 may contain at least one dopant element derived from metallic layer 230 and/or lower electrode 220. In some embodiments, metallic layer 230 may be deposited or otherwise formed from a doped metal source or doped during a deposition process. Alternatively, metallic layer 230 may be deposited or otherwise formed on lower electrode 220 and subsequently, doped with a dopant element. Similarly, the silicon material of lower electrode 220 may be deposited or otherwise formed from a doped silicon source or doped during a deposition process. Alternatively, lower electrode 220 may be deposited or otherwise formed on substrate 210 and subsequently, the silicon material may be doped with a dopant element.

FIG. 2A depicts one stage of the fabrication or otherwise formation of memory device 200 which contains lower electrode 220 deposited or otherwise formed on substrate 210 during step 110 of process 100. Substrate 210 supports lower electrode 220 while depositing and forming each of the layers within memory device 200—and for subsequent manufacturing processes. Substrate 210 may be a wafer or other substrate and may contain silicon, doped silicon, Group III-V materials (e.g., GaAs), or derivates thereof. In most examples described herein, substrate 210 is a crystalline silicon wafer that may be doped with a dopant element.

Lower electrode 220 contains a silicon material, such as a doped silicon material, for example, p-type or n-type (N+) silicon material. In one example, lower electrode 220 contains doped polycrystalline silicon, such as n-type, polysilicon. Lower electrode 220 generally has a thickness within a range from about 100 Å to about 5,000 Å, such as from about 200 Å to about 2,000 Å, such as from about 500 Å to about 1,000 Å, for example, about 700 Å, prior to exposing lower electrode 220 to etching processes described herein.

In some embodiments, the silicon material of lower electrode 220 may contain at least one dopant element (e.g., fluorine) for eventually incorporating or doping into metal silicide layer 240, metal oxide layer 250, the interface between metal silicide layer 240 and metal oxide layer 250, and/or the interface between lower electrode 220 and metal silicide layer 240. The silicon material of lower electrode 220 may be deposited or otherwise formed from a doped silicon source or doped during a deposition process. Alternatively, lower electrode 220 may be deposited or otherwise formed on substrate 210 and subsequently, the silicon material may be doped with a dopant element.

The dopant element may be dispersed in different regions or depths of lower electrode 220. Generally, the dopant element may be dispersed throughout an upper layer of lower electrode 220, such as about 50% or less of the upper thickness of lower electrode 220, such as about 30% or less of the upper thickness, such as about 15% or less of the upper thickness, such as about 5% or less of the upper thickness. In one example, the dopant element is fluorine, and the silicon material of lower electrode 220 has a fluorine concentration within a range from about 0.5 at % to about 5 at %, such as from about 1 at % to about 4 at %, such as from about 2 at % to about 3 at %.

FIG. 2B depicts another stage of the fabrication or otherwise formation of memory device 200 which includes depositing or otherwise forming metallic layer 230 on lower electrode 220 during step 120 of process 100. In many embodiments, metallic layer 230 contains a metal, such as hafnium, zirconium, alloys thereof, or combinations thereof. Generally, metallic layer 230 may have a thickness within a range from about 5 Å to about 100 Å, such as from about 10 Å to about 80 Å, such as from about 20 Å to about 50 Å, for example, about 40 Å. Metallic layer 230 may be deposited, plated, or otherwise formed by a process such as physical vapor deposition (PVD) or other sputtering process, chemical vapor deposition (CVD), atomic layer deposition (ALD), laser ablation, or electroless deposition.

In some embodiments, metallic layer 230 further contains at least one dopant element. The dopant element may be dispersed in different regions or depths of metallic layer 230. Exemplary dopant elements for metallic layer 230 include aluminum, yttrium, scandium, gadolinium, alloys thereof, or combinations thereof. In many examples, metallic layer 230 contains aluminum as a dopant element. Metallic layer 230 may have a dopant element concentration within a range from about 5 at % (atomic percent) to about 15 at %. In one example, metallic layer 230 has an aluminum concentration within a range from about 5 at % to about 15 at %. In one example, metallic layer 230 contains hafnium and also contains aluminum as the dopant element. In another example, metallic layer 230 contains zirconium and also contains aluminum as the dopant element. The dopant element may be deposited by a sputtering, co-sputtering, or other PVD process, as well as by CVD, ALD, laser ablation, implantation, electrochemical plating, or electroless deposition. The dopant element may be deposited subsequently to metallic layer 230, or usually, may be deposited simultaneously as the metal of metallic layer 230.

In various embodiments, metallic layer 230 may be deposited or otherwise formed from a doped metal source or doped during a deposition process. In some examples, a hafnium alloy target or a zirconium alloy target may contain with at least one doping element (e.g., Al, Y, Sc, or Gd) and may be utilized while depositing or forming metallic layer 230. For example, a hafnium target containing aluminum or a zirconium target containing aluminum may be sputtered during a sputtering process or other PVD process while depositing or forming metallic layer 230. In other examples, a hafnium target or a zirconium target may be co-sputtered with at least another target containing at least one doping element (e.g., Al, Y, Sc, or Gd) while depositing or forming metallic layer 230. For example, a hafnium target or a zirconium target may be co-sputtered with an aluminum target while depositing or forming metallic layer 230 during a PVD process. In additional examples to form doped metallic layer 230, an ALD process may be utilized while depositing a plurality of layers containing metallic hafnium or metallic zirconium separated by one or more layers containing at least one doping element (e.g., Al, Y, Sc, or Gd). For example, doped metallic layer 230 may contain a plurality of layers containing metallic hafnium or metallic zirconium separated by one or more layers containing metallic aluminum wherein each of the metallic layers (e.g., Hf, Zr, or Al) may be deposited during ALD processes.

In other embodiments, metallic layer 230 may be deposited or otherwise formed on lower electrode 220 and subsequently, metallic layer 230 may be doped with the dopant element. For example, the dopant element may be implanted or otherwise incorporated into metallic layer 230 by an ion implantation process.

FIG. 2C depicts another stage of the fabrication or otherwise formation of memory device 200 which includes exposing metallic layer 230 to an activated oxygen source while heating metallic layer 230 to an oxidizing temperature and forming metal oxide layer 250 from an upper portion of metallic layer 230 during an oxidation process during step 130 of process 100. Metal oxide layer 250 contains a resistive switching metal oxide material, such as hafnium oxide, zirconium oxide, hafnium aluminum oxide, zirconium aluminum oxide, derivatives thereof, doped variants thereof, or combinations thereof. Metal oxide layer 250 may have a thickness within a range from about 20 Å to about 80 Å, such as from about 20 Å to about 60 Å, such as from about 30 Å to about 50 Å, for example, about 40 Å.

In many embodiments, the oxidation process utilizes activated oxygen sources, and therefore the oxidizing temperature may be less than a typical thermal oxidation process. In some embodiments, the oxidizing temperature may be about 600° C. or less, such as within a range from about 300° C. to about 600° C., such as from about 350° C. to about 550° C., such as from about 400° C. to about 500° C. during the oxidation process. In other embodiments, the oxidizing temperature may be about 300° C. or less, such as about 200° C. or less, such as about 100° C. or less, such as within a range from about 10° C. to about 100° C., such as from about 10° C. to about 50° C., such as from about 15° C. to about 30° C. during the oxidation process. In some examples of the oxidation process, an ultraviolet source may be utilized to form ozone and the oxidizing temperature is generally about at room temperature, such as within a range from about 15° C. to about 30° C. The oxidizing temperature is usually maintained for a time period within a range from 30 seconds to about 10 minutes, such as from about 1 minute to about 5 minutes, such as from about 2 minutes to about 4 minutes during the oxidation process.

The activated oxygen source may contain or may be formed from at least one oxygen source. Exemplary oxygen sources includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), derivatives thereof, plasmas thereof, or combinations thereof. In many examples, the activated oxygen source contains atomic oxygen or ozone. In some examples, an ultraviolet source is utilized to form ozone. Metallic layer 230 may be exposed to the UV generated ozone at room temperature, such as within a range from about 15° C. to about 30° C., while forming metal oxide layer 250 during the oxidation process during step 130. Ozone may be formed by an ozone generator which may employ an UV source, a plasma source, a hot-wire source, or other sources utilized for forming ozone. In other examples, metallic layer 230 is exposed to an oxygen plasma as the activated oxygen source while forming metal oxide layer 250. The oxygen plasma or other plasmas of the activated oxygen may be formed remotely, such as by a remote plasma system (RPS) or within the deposition chamber, such as by an in situ plasma oxidation chamber.

Figure 2D:
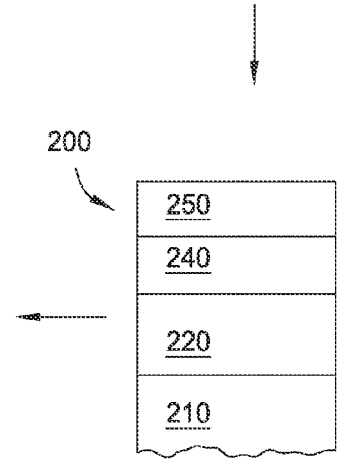

FIG. 2D depicts another stage of the fabrication or otherwise formation of memory device 200 which includes heating substrate 210 containing metallic layer 230 to an annealing temperature while forming metal silicide layer 240 from a lower portion of metallic layer 230 during a silicidation process during step 140 of process 100. Metal silicide layer 240 contains a metal silicide material, such as hafnium silicide, zirconium silicide, derivatives thereof, doped variants thereof, or combinations thereof. In some embodiments, a silicate material, such as hafnium silicate, zirconium silicate, or doped variants thereof, may be formed at or near the interface of metal silicide layer 240 and metal oxide layer 250. Metal silicide layer 240 has a thickness within a range from about 5 Å to about 40 Å, such as from about 8 Å to about 25 Å, such as from about 10 Å to about 20 Å, for example, about 15 Å.

Memory device 200 may be exposed to an annealing gas which may contain argon, nitrogen, helium, air, mixtures thereof, or combinations thereof while forming metal silicide layer 240 during the silicidation process. The annealing temperature during step 140 is usually greater than 600° C. and may be as high as about 1,000° C. In one embodiment, the annealing temperature may be within a range from greater than 600° C. to about 850° C. In another embodiment, the annealing temperature may be within a range from about 615° C. to about 1,000° C., such as from about 625° C. to about 800° C., such as from about 650° C. to about 750° C. during the silicidation process. The annealing temperature may be maintained for a time period within a range from about 10 seconds to about 5 minutes, such as from about 30 seconds to about 90 seconds, such as from about 45 seconds to about 75 seconds, for example, about 1 minute, during the silicidation process.

In other embodiments, the silicon material contained within lower electrode 220 further contains at least one dopant element. In one example, the dopant is fluorine and the silicon material contained within lower electrode 220 has a fluorine concentration within a range from about 0.5 at % to about 5 at %, such as from about 1 at % to about 4 at %, such as from about 2 at % to about 3 at %. The fluorine forms silicon fluoride bonds at the interface of metal oxide layer 250 and metal silicide layer 240 or at the interface of lower electrode 220 and metal silicide layer 240. In some examples, the dopant element, such as fluorine, may be implanted or otherwise incorporated into the metallic layer by an ion implantation process.

In one example of a silicidation process, lower electrode 220 and the lower portion of metallic layer 330 may be heated to a temperature within a range from about 650° C. to about 750° C. for a time period within a range 30 seconds to about 90 seconds while forming metal silicide layer 240. A rapid thermal anneal (RTA) chamber containing an atmosphere of argon or nitrogen may be utilized during the silicidation process.

FIG. 2E depicts another stage of the fabrication or otherwise formation of memory device 200 which includes forming upper electrode 260 over metal oxide layer 250 during step 150 of process 100. In many examples, upper electrode 260 contains titanium nitride or derivatives thereof.

Lower electrode 220 and upper electrode 260 may contain different materials. In some embodiments, lower electrode 220 and upper electrode 260 have work functions that differ by an energy level within a range from about 0.1 eV to about 1 eV, such as, from about 0.4 eV to about 0.6 eV. In some examples, lower electrode 220 may contain a n-type polysilicon material which has a work function within a range from about 4.1 eV to about 4.15 eV and upper electrode 260 may contain a titanium nitride material which has a work function within a range from about 4.5 eV to about 4.6 eV. Other electrode materials that may be contained within lower electrode 220 and/or upper electrode 260 include p-type polysilicon (about 4.9 eV to about 5.3 eV), transition metals, transition metal alloys, transition metal nitrides, transition metal carbides, tungsten (about 4.5 eV to about 4.6 eV), tantalum nitride (about 4.7 eV to about 4.8 eV), molybdenum oxide (about 5.1 eV), molybdenum nitride (about 4.0 eV to about 5.0 eV), iridium (about 4.6 eV to about 5.3 eV), iridium oxide (about 4.2 eV), ruthenium (about 4.7 eV), and ruthenium oxide (about 5.0 eV). Other potential electrode materials for lower electrode 220 and/or upper electrode 260 include a titanium/aluminum alloy (about 4.1 eV to about 4.3 eV), nickel (about 5.0 eV), tungsten nitride (about 4.3 eV to about 5.0 eV), tungsten oxide (about 5.5 eV to about 5.7 eV), aluminum (about 4.2 eV to about 4.3 eV), copper or silicon-doped aluminum (about 4.1 eV to about 4.4 eV), copper (about 4.5 eV), hafnium carbide (about 4.8 eV to about 4.9 eV), hafnium nitride (about 4.7 eV to about 4.8 eV), niobium nitride (about 4.95 eV), tantalum carbide (about 5.1 eV), tantalum silicon nitride (about 4.4 eV), titanium (about 4.1 eV to about 4.4 eV), vanadium carbide (about 5.15 eV), vanadium nitride (about 5.15 eV), and zirconium nitride (about 4.6 eV). For some embodiments described herein, the higher work function electrode receives a positive pulse (as measured compared to a common reference potential) during a reset operation, although other configurations are possible.

In other embodiments, the higher work function electrode receives a negative pulse during a reset operation. Upper electrode 260 may contain metals, metal carbides, metal oxides, or metal nitrides, which include platinum, palladium, ruthenium, ruthenium oxide, iridium, iridium oxide, titanium, titanium nitride, tungsten, tungsten oxide, tungsten nitride, tungsten carbide, tantalum, tantalum oxide, tantalum nitride, tantalum silicon nitride, tantalum carbide, molybdenum, molybdenum oxide, molybdenum nitride, titanium aluminum alloys, nickel, aluminum, doped aluminum, aluminum oxide, copper, hafnium carbide, hafnium nitride, niobium nitride, vanadium carbide, vanadium nitride, zirconium nitride, derivatives thereof, or combinations thereof. In many examples, upper electrode 260 contains titanium, titanium nitride, alloys thereof, or combinations thereof.

Memory device 200 containing upper electrode 260 disposed on or over metal oxide layer 250 may optionally be exposed to a second annealing process, such as a post electrode anneal. The post electrode anneal occurs subsequent to the formation of upper electrode 260. During the post electrode anneal, memory device 200, including upper electrode 260 and metal oxide layer 250, may be heated to an annealing temperature within a range from about 400° C. to about 1,000° C., such as from about 500° C. to about 900° C., or from about 700° C. to about 800° C., for example, about 750° C. Generally, memory device 200 may be heated for a time period within a range from about 10 seconds to about 5 minutes, such as from about 20 seconds to about 4 minutes, or from about 40 seconds to about 2 minutes during the post upper electrode anneal. The post electrode anneal may be conducted within an annealing chamber, vacuum chamber, deposition chamber, or other processing chamber that provides heat to the layers contained within memory device 200, such as metal oxide layer 250 and upper electrode 260.

In some examples, memory device 200 containing upper electrode 260 may be heated to an annealing temperature within a range from about 700° C. to about 800° C. for a time period within a range from about 40 seconds to about 2 minutes during the post upper electrode anneal at step 135. In one example, the annealing temperature of about 750° C. for about 1 minute is used during the annealing process.

Figure 3:
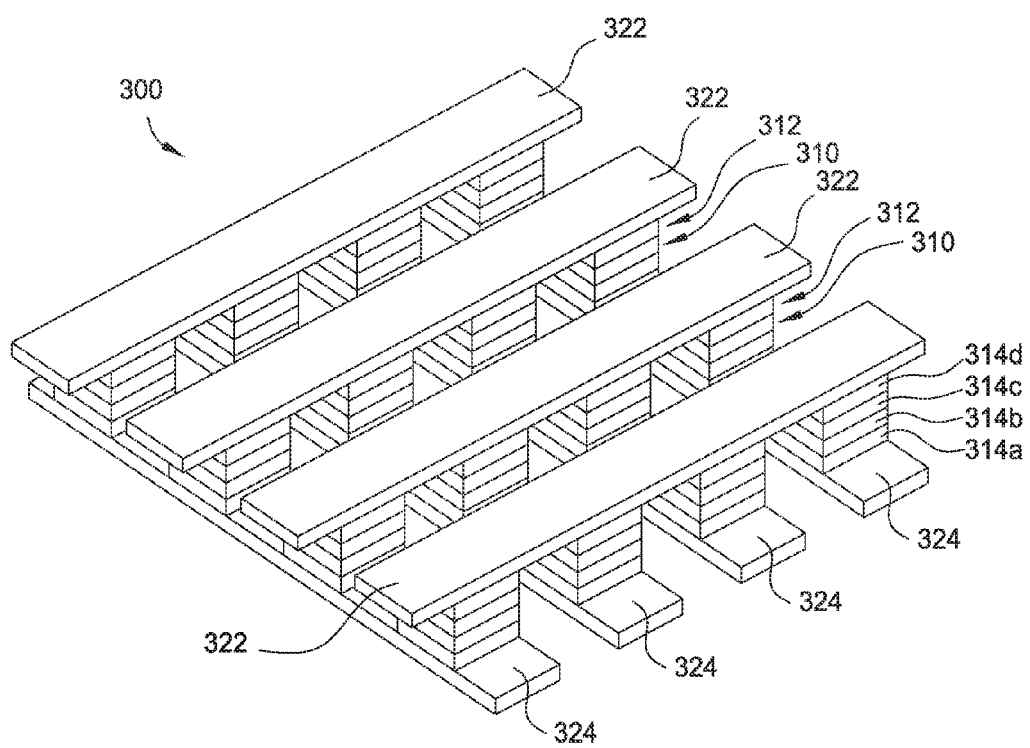
FIG. 3 depicts a memory array of resistive switching memory devices, as described by another embodiment herein.

FIG. 3 depicts a memory array 300 of resistive switching memory devices 310, as described by embodiments herein. Each memory device 310 contains at least one switching memory element 312, and may contain multiple switching memory elements 312. In some embodiments, memory devices 310 may be a plurality of memory devices 200, depicted in FIG. 2H. Memory array 300 may be part of a larger memory device or other integrated circuit structure, such as a system on a chip type device. Read and write circuitry is connected to switching memory devices 310 using electrodes 322 and electrodes 324. Electrodes, such as upper electrodes 322 and lower electrodes 324, are sometimes referred to as word lines and bit lines, and are used to read and write data into the memory elements 312 in the switching memory devices 310. Individual switching memory devices 310 or groups of switching memory devices 310 can be addressed using appropriate sets of electrodes 322 and 324. The memory elements 312 in the switching memory devices 310 may be formed from a plurality of layers 314a, 314b, 314c, and 314d containing various materials, as indicated schematically in FIG. 3. In addition, memory arrays such as memory array 300 can be stacked in a vertical fashion to make multilayer memory array structures.

According to various embodiments, resistive-switching memory elements/devices are described herein. The memory elements/devices generally have a structure in which resistive-switching insulating layers are surrounded by two conductive electrodes. Some embodiments described herein are memory elements that include electrodes of different materials (e.g., one electrode is doped silicon and one is titanium nitride) surrounding a resistive-switching layer of a metal oxide (e.g., hafnium oxide), thickness (about 20 Å to about 100 Å) and a coupling layer that is substantially thinner than the resistive-switching layer (e.g., less than 25% the thickness of the resistive-switching layer). In some embodiments, the coupling layer may be a metallic material such as titanium. Memory elements including the coupling layer have exhibited improved switching characteristics (e.g., lower set, reset, and forming voltages, and better retention). In some embodiments, the resistive-switching layer includes a higher bandgap material (e.g., a material having a bandgap greater than 4 eV such as hafnium oxide, aluminum oxide, tantalum oxide, yttrium oxide, zirconium oxide, cerium oxide, alloys thereof, derivatives thereof, or combinations thereof), however other resistive-switching layers may include materials having a bandgap less than 4 eV (e.g., titanium oxide).

In other embodiments, a metal-rich metal oxide switching layer and techniques for forming the metal-rich switching layer are described. The metal-rich switching layer includes increased numbers of defects (e.g., oxygen vacancies), which may be manipulated to improve switching characteristics. The metal-rich switching layer may be deposited, for example, by reducing the degree of oxidation that is occurs in an ALD or PE-ALD process. In another embodiment, the coupling layer is a metallic layer (e.g., metallic titanium) that, when the memory is annealed, attracts oxygen from the adjacent metal oxide switching layer. This results in an at least partially oxidized coupling layer (e.g., the coupling layer becomes at least partially titanium oxide) and a switching layer that is metal rich. In further embodiments, a metallic capping layer deposited on a coupling layer may be used as a source of dopant metal which is diffused into the metal host oxide of the switching layer.

The switching characteristics of the resistive-switching memory elements may be tailored by controlling the defects within the metal oxides. Switching characteristics include operating voltages (e.g., set, reset, and forming voltages), operating currents (e.g., on and off currents), and data retention. Defect control may be achieved by type, density, energy level, and spatial distribution within the switching layer. These defects then modulate the current flow based on whether they are filled (passivated/compensated) or unfilled (uncompensated). Adding different layers, controlling the formation of the switching layer, implanting, controlling stress, certain thermal treatments are all used to control the defect characteristics. In addition, the defects need not be mobile. For example, a coupling layer and a metallic capping layer may be used to control locations, depths, densities, and/or type of defects, and techniques may be used to form a switching layer having an increased number of defects.

Additionally, the switching layer may have any phase (e.g., crystalline and amorphous) or mixtures of multiple phases. Amorphous-phase metal oxides may have increased resistivity, which in some embodiments can lower the operational currents of the device to reduce potential damage to the memory element.

While the foregoing is directed to embodiments of the invention, other and further embodiments of the invention may be devised without departing from the basic scope thereof, and the scope thereof is determined by the claims that follow.

We claim:

1. A method for fabricating a resistive switching memory device, the method comprising:
    providing a substrate comprising a lower electrode,
        wherein the lower electrode comprises silicon;
    forming a metallic layer on the lower electrode,
        the metallic layer comprises one of hafnium or zirconium,
        the metallic layer having a lower portion facing the lower electrode and an upper portion facing away from the lower electrode;
    forming a metal oxide layer from the upper portion of the metallic layer,
        wherein forming the metal oxide layer comprises heating the metallic layer to a temperature of less than 600° C. and exposing the metallic layer to an activated oxygen source; and
    forming a metal silicide layer from the lower portion of the metallic layer,
        wherein forming the metal silicide layer comprises heating the metallic layer and the lower electrode to a temperature of greater than 600° C. and transferring a portion of the silicon from the lower electrode and into the lower portion of the metallic layer.

2. The method of claim 1, wherein the metal silicide layer is formed after forming the metal oxide layer.

3. The method of claim 1, wherein the metallic layer has a thickness of between 5 Angstroms and 100 Angstroms prior to forming the metal oxide layer and the metal silicide layer.

4. The method of claim 1, wherein the metallic layer has a thickness of between 10 Angstroms and 80 Angstroms prior to forming the metal oxide layer and the metal silicide layer.

5. The method of claim 1, wherein the metallic layer has a thickness of between 20 Angstroms and 40 Angstroms prior to forming the metal oxide layer and the metal silicide layer.

6. The method of claim 1, wherein the metallic layer is formed using one of physical vapor deposition (PVD), chemical vapor deposition (CVD), atomic layer deposition (ALD), laser ablation, or electroless deposition.

7. The method of claim 1, wherein the metallic layer comprises a dopant prior to forming the metal oxide layer and the metal silicide layer, the dopant comprising one of aluminum, yttrium, scandium, or gadolinium.

8. The method of claim 7, wherein the dopant has a concentration of between 5% atomic and 15% atomic.

9. The method of claim 1, wherein the activated oxygen source comprises atomic oxygen or ozone.

10. The method of claim 1, wherein the metallic layer is heated to a temperature of less than 300° C. while forming the metal oxide.

11. The method of claim 1, wherein the metal oxide layer has a thickness of 20 Angstroms and 80 Angstroms.

12. The method of claim 1, wherein the metal oxide layer has a thickness of 30 Angstroms and 50 Angstroms.

13. The method of claim 1, wherein the metallic layer and the lower electrode are heated to a temperature of between 650° C. and 750° C. while forming the metal silicide layer.

14. The method of claim 1, wherein forming the metal silicide layer further comprises exposing the substrate to an annealing gas, the annealing gas comprising one of argon, nitrogen, helium, or air.

15. The method of claim 1, wherein the lower electrode further comprises a dopant prior to forming the metal silicide.

16. The method of claim 15, wherein the dopant comprises fluorine and has a concentration of between 0.5% atomic and 5% atomic.

17. The method of claim 1, wherein the silicon of the lower electrode is polycrystalline silicon.

18. The method of claim 1, further comprising forming an upper electrode, wherein the upper electrode is formed after forming the metal silicide.

19. The method of claim 18, further comprising annealing the resistive switching memory device after forming the upper electrode, the annealing comprising heating the resistive switching memory device to between about 400° C. and 1000° C.

* * * * *